United States Patent
Hwang et al.

(10) Patent No.: US 8,941,140 B2
(45) Date of Patent: Jan. 27, 2015

(54) LIGHT-EMITTING DEVICE INCLUDING NITRIDE-BASED SEMICONDUCTOR OMNIDIRECTIONAL REFLECTOR

(71) Applicant: Samsung Electronics Co., Ltd., Gyeonggi-do (KR)

(72) Inventors: Kyung-wook Hwang, Gyeonggi-do (KR); Seong-eun Park, Gyeonggi-do (KR); Hun-jae Chung, Gyeonggi-do (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/844,632

(22) Filed: Mar. 15, 2013

(65) Prior Publication Data
US 2013/0248911 A1   Sep. 26, 2013

(30) Foreign Application Priority Data
Mar. 22, 2012   (KR) .......... 10-2012-0029413

(51) Int. Cl.
*H01L 33/60* (2010.01)
*H01L 33/00* (2010.01)
*H01L 33/10* (2010.01)

(52) U.S. Cl.
CPC .............. *H01L 33/60* (2013.01); *H01L 33/10* (2013.01)
USPC ................ 257/98; 257/E33.069; 438/29

(58) Field of Classification Search
USPC .............. 257/98, E33.069; 438/29
See application file for complete search history.

(56) References Cited

U.S. PATENT DOCUMENTS

| | | | |
|---|---|---|---|
| 6,306,672 B1 * | 10/2001 | Kim | 438/22 |
| 7,550,395 B2 * | 6/2009 | Hu et al. | 438/746 |
| 8,390,006 B2 * | 3/2013 | Kang et al. | 257/94 |
| 2002/0036295 A1 * | 3/2002 | Nunoue et al. | 257/98 |
| 2004/0021147 A1 | 2/2004 | Ishibashi et al. | |
| 2004/0150001 A1 * | 8/2004 | Shchukin et al. | 257/183 |
| 2004/0169188 A1 * | 9/2004 | Nunoue et al. | 257/98 |
| 2008/0002750 A1 * | 1/2008 | Onishi et al. | 372/50.11 |
| 2008/0179605 A1 * | 7/2008 | Takase et al. | 257/94 |

FOREIGN PATENT DOCUMENTS

| | | |
|---|---|---|
| JP | 1999-0084333 A | 12/1999 |
| JP | 3911699 B2 | 5/2007 |
| KR | 2000-0038997 A | 7/2000 |
| KR | 2011-0094575 A | 8/2011 |

* cited by examiner

*Primary Examiner* — Cheung Lee
*Assistant Examiner* — Jeremy Joy
(74) *Attorney, Agent, or Firm* — McDermott Will & Emery LLP

(57) ABSTRACT

A light-emitting device includes a nitride-based semiconductor reflector. The light-emitting device includes a nitride-based reflector and a light-emitting unit that is disposed on the nitride-based reflector. The nitride-based reflector includes undoped nitride semiconductor layers and heavily-doped nitride semiconductor layers that are alternately stacked. The heavily doped nitride semiconductor layers are etched at their edges to form air layers between adjacent undoped nitride semiconductor layers.

9 Claims, 3 Drawing Sheets

LIGHT-EMITTING DEVICE INCLUDING NITRIDE-BASED SEMICONDUCTOR OMNIDIRECTIONAL REFLECTOR

CROSS-REFERENCE TO RELATED APPLICATIONS

This application claims the benefit of priority to Korean Patent Application No. 10-2012-0029413, filed on Mar. 22, 2012, in the Korean Intellectual Property Office, the disclosure of which is incorporated herein in its entirety by reference.

BACKGROUND

The inventive concept relates to a light-emitting device including an omnidirectional reflector in which two nitride-based semiconductor layers having different refractive indices are alternately formed.

A light-emitting device chip, for example, a light-emitting diode (LED), refers to a semiconductor device that displays multi-color light by forming a light-emitting source through a PN junction between compound semiconductors. An LED has advantages of a long lifetime, small and light design, and low energy consumption due to good light directivity. Also, since an LED is durable against impact and vibration, the LED does not require a pre-heating time and a complex operation, and may be packaged in various forms. These permit the LED to be used for various applications.

When a GaN LED is grown on a heterogeneous substrate, in order to effectively extract light in one direction, a reflector is disposed in a direction opposite to a direction to which a light-emitting unit extracts light. When a reflector formed of a metal material is deposited, it is difficult to have a reflectance of about 100% by using only the reflector. When materials having different refractive indices are alternately deposited, it is difficult to grow a high quality light-emitting unit due to mismatch between the materials and the light-emitting unit that is deposited on the materials. Also. since a multi-layer structure is required due to a small refractive index difference between adjacent layers, a time taken to manufacture a reflector is increased.

SUMMARY

The inventive concept provides a light-emitting device including an omnidirectional reflector having a nitride semiconductor stacked structure in which a refractive index difference between adjacent layers is high.

An aspect of the inventive concept encompasses a light-emitting device including a nitride-based semiconductor omnidirectional reflector. The light-emitting device includes a nitride-based reflector, and a light-emitting unit that is disposed on the nitride-based reflector. The nitride-based reflector is formed such that undoped nitride semiconductor layers and heavily doped nitride semiconductor layers are alternately stacked, and the heavily doped nitride semiconductor layers are etched from their edges to form air layers between adjacent undoped nitride semiconductor layers.

The nitride-based reflector may be formed of GaN.

The nitride-based reflector may include 5 to 10 undoped nitride semiconductor layers, and heavily doped nitride semiconductor layers disposed between the undoped nitride semiconductor layers.

An area of each of the heavily doped nitride semiconductor layers is about 10 to 20% of a total area of each of the heavily doped nitride semiconductor layers and each of the air layers.

A height of the air layer may range from about 100 to 200 nm.

A height of the undoped nitride semiconductor layer may range from 20 to 100 nm.

The light-emitting unit may be grown on an uppermost layer of the nitride-based reflector.

Another aspect of the inventive concept relates to a light-emitting device including a nitride-based semiconductor omnidirectional reflector, the light-emitting device including: a nitride-based reflector; and a light-emitting unit that is disposed on the nitride-based reflector. The nitride-based reflector is formed such that undoped nitride semiconductor layers and heavily doped nitride semiconductor layers are alternately stacked, and each of the heavily doped nitride semiconductor layers includes a plurality of air holes.

Still another aspect of the inventive concept provides a method for forming a light-emitting device. The method forms a first number of first GaN layers and a second number of second GaN layers to be stacked alternately such that the uppermost layer and the lowermost layer are the first GaN layers, and removes a portion of some of the first GaN layers and some of the second GaN layers. The method further etches edge portions of some of the second GaN layers to form air layers between adjacent first GaN layers, and forms a light-emitting unit on the uppermost first GaN layer.

The method further forms a substrate, and a buffer layer formed of GaN on the substrate. The first number of first GaN layers and the second number of second GaN are formed on the buffer layer.

The removing a portion of some of the first GaN layers and some of the second GaN layers removes edges of the first GaN layers and edges of the second GaN layers except the lowermost first GaN layer and the lowermost second GaN layer.

The forming of the air layers forms an electrode on the exposed second GaN layer, and applies a positive voltage to the electrode and a negative voltage to the substrate.

The forming of the light-emitting layer forms a first type semiconductor layer on the uppermost first GaN layer, an active layer on the first type semiconductor layer, and a second type semiconductor layer on the active layer.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
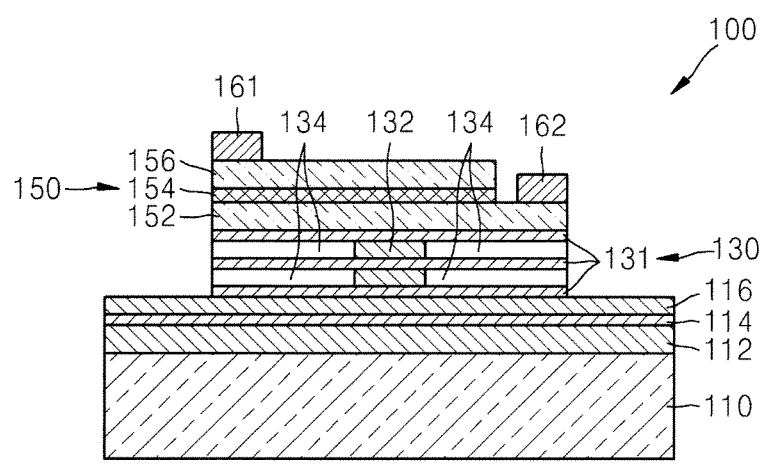
FIG. 1 is a cross-sectional view of a light-emitting device according to an embodiment of the inventive concept.

The inventive concept will now be described more fully with reference to the accompanying drawings, in which exemplary embodiments of the inventive concept are shown. In the drawings, the same reference numerals denote the same elements and sizes or thicknesses of elements may be exaggerated for clarity. It will also be understood that when a layer is referred to as being "on" another layer or a substrate, it can be directly on the other layer or the substrate, or intervening layers may also be present therebetween.

FIG. 1 is a cross-sectional view illustrating a light-emitting device 100 according to an embodiment of the inventive concept.

Referring to FIG. 1, the light-emitting device 100 includes a GaN-based reflector 130 that is formed on a substrate 110 and a light-emitting unit 150 that is formed on the reflector 130. The substrate 110 may be formed of, for example, silicon (Si) or sapphire.

A buffer layer 112 that is formed of GaN and one pair of GaN layers that are sequentially stacked on the buffer layer 112 may be formed between the reflector 130 and the substrate 110. The one pair of GaN layers may be a GaN layer 114 that is not doped with impurities and an n-GaN layer 116.

The buffer layer 112 may be formed of a material whose lattice structure is matched to that of the GaN layers 114 and 116 that are epitaxially grown on the buffer layer 112. For example, the buffer layer 112 may be a GaN layer. The buffer layer 112 may not be doped with impurities. When the buffer layer 112 is formed of GaN, the GaN layer 114 may be omitted.

The reflector 130 formed of GaN is formed on the n-GaN layer 116. The reflector 130 may be formed by alternately stacking first GaN layers 131 that are lightly doped or undoped with impurities and second GaN layers 132 that are n-doped. An uppermost layer of the reflector 130 is the first GaN layer 131. An impurity concentration of each of the second GaN layers 132 may be equal to or greater than $10^{19} cm^{-3}$, and an impurity concentration of each of the first GaN layers 131 may be equal to or less than $10^{17} cm^{-3}$. Hereinafter, the first GaN layer 131 may be referred to as an undoped GaN layer.

The reflector 130 may include, for example, five to ten of first GaN layers 131 and second GaN layers 132 formed between the first GaN layers 131. In FIG. 1, for convenience, three first GaN layers 131 and two second GaN layers 132 are formed between the first GaN layers 131. The second GaN layer 132 of the reflector 130 is formed such that edges of the second GaN layer 132 between adjacent first GaN layers 131 are etched. The etched edges of the second GaN layer 132 are filled with air. Hereinafter, the space in which air is filled is referred to as an air layer 134. Since the air layer 134 has a refractive index different from that of the first GaN layer 131, the air layer 134 of the reflector 130 enables light emitted by the light-emitting unit 150 to be reflected upward (when viewed in FIG. 1).

Since the second GaN layer 132 surrounded by the air layer 134 has little refractive index difference from the first GaN layer 131, reflection efficiency of the second GaN layer 132 is lower than that of the air layer 134. Accordingly, when an area of the air layer 134 is greater than an area of the second GaN layer 132 surrounded by the air layer 134, reflection efficiency of the reflector 130 is improved. An area of the second GaN layer 132 may be about 10 to 20% of a total area of the second GaN layer 132 and the air layer 134. When an area of the second GaN layer 132 is less than 10%, the reflector 130 is structurally unstable and thus may be easily broken. When an area of the second GaN layer 132 is greater than 20%, reflection efficiency of the reflector 130 may be reduced.

An area of the air layer 134 may be adjusted according to a voltage during electrochemical etching which will be described below, a doping concentration of the second GaN layer 132, and an etching time.

A height of the air layer 134, that is, a height of the second GaN layer 132 between adjacent first GaN layers 131, may range from about 100 to 200 nm. A height of the first GaN layer 131 may range from about 20 to 100 nm.

Since the reflector 130 is formed by stacking layers having a large refractive index difference, the reflector 130 reflects almost 100% of light in every direction. Accordingly, the reflector 130 may be referred to as an omnidirectional reflector.

The light-emitting unit 150 is formed on the uppermost first GaN layer 131 of the reflector 130. The light-emitting unit 150 is epitaxially grown on the first GaN layer 131. The light-emitting unit 150 may include an n-type semiconductor layer 152 formed on the first GaN layer 131, a p-type semiconductor layer 156. and an active layer 154 that is disposed between the n-type semiconductor layer 152 and the p-type semiconductor layer 156. A p-type electrode 161 is formed on the p-type semiconductor layer 156, and an n-type electrode 162 is connected to the n-type semiconductor layer 152. In FIG. 1, the p-type semiconductor layer 156 and the active layer 154 are etched in a mesa shape to expose a portion of the n-type semiconductor layer 152, and the n-type electrode 162 is formed on the exposed portion of the n-type semiconductor layer 152.

Then-type semiconductor layer 152 may be formed of a nitride semiconductor doped with n-type impurities. That is, the n-type semiconductor layer 152 may be formed by doping a semiconductor material having a composition represented by $Al_x In_y Ga_{(1-x-y)} N$ (where $0 \leq x \leq 1$, $0 \leq y \leq 1$, and $0 \leq x+y \leq 1$) with n-type impurities. Examples of the nitride semiconductor used to form the n-type semiconductor layer 152 may include GaN, AlGaN, and InGaN, and examples of the n-type impurities may include Si, germanium (Ge), selenium (Sc), and tellurium (Te). Then-type semiconductor layer 152 may be grown by using metal-organic chemical vapor deposition (MOCVD), hydride vapor phase epitaxy (HVPE), or molecular beam epitaxy (MBE).

The active layer 154 may be formed of a semiconductor material having a composition represented by $In_x Ga_{1-x} N$ ($0 \leq x \leq 1$) which may emit light having predetermined energy due to recombination between electrons and holes and may adjust band gap energy according to the content of indium. Also, the active layer 154 may be a multi-quantum well (MQW) layer in which quantum barrier layers and quantum well layers are alternately stacked.

The p-type semiconductor layer 156 may be formed of a nitride semiconductor doped with p-type impurities. That is, the p-type semiconductor layer 156 may be formed by doping a semiconductor material having a composition represented by $Al_x In_y Ga_{(1-x-y)} N$ (where $0 \leq x \leq 1$, $0 \leq y \leq 1$, and $0 \leq x+y \leq 1$) with p-type impurities. Examples of the nitride semiconductor used to form the p-type semiconductor layer 156 may include GaN, AlGaN, and InGaN, and examples of the p-type impurities may include magnesium (Mg), zinc (Zn), and beryllium (Be). The p-type semiconductor layer 156 may be grown by using MOCVD, HVPE, or MBE.

Since light generated by the active layer 154 is reflected upward by the reflector 130 formed under the light-emitting unit 150. 1, light extraction efficiency of the light-emitting device 100 of FIG. 1 may be improved.

Also, since the light-emitting device 100 having a small chip size is formed at a wafer level, stress and internal defects are reduced, thereby improving light extraction efficiency.

FIGS. 2A through 2E are cross-sectional views for explaining a method of manufacturing a light-emitting device 200, according to an embodiment of the inventive concept.

Figure 2A:
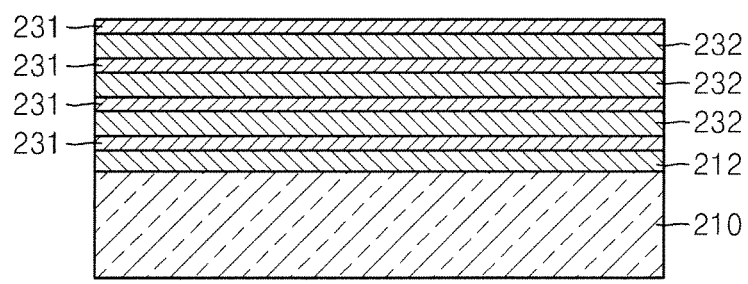
FIGS. 2A through 2E are cross-sectional views of a light-emitting device for explaining a method of manufacturing the light-emitting device, according to an embodiment of the inventive concept.

Referring to FIG. 2A, a buffer layer 212 formed of GaN is formed on a substrate 210, and first GaN layers 231 that are undoped or lightly doped with impurities, for example, n-type impurities and second GaN layers 232 that are heavily doped with n-type impurities are alternately formed on the buffer layer 212. The number of the first GaN layers 231 may be 6 to 11, and the number of the second GaN layers 232 may be 5 to 10. For convenience, in FIGS. 2A through 2E, four first GaN layers 231 and three second GaN layers 232 are disposed between the first GaN layers 231.

The buffer layer 212 may be formed of a material whose lattice structure is matched to that of the first and second GaN layers 231 and 232 epitaxially grown on the buffer layer 212. For example, the buffer layer 212 may be a GaN layer. The buffer layer 212 may be undoped. The buffer layer 212 and the first GaN layers 231 disposed on the buffer layer 212 may constitute one layer. The buffer layer 212 and the first and second GaN layers 231 and 232 disposed on the buffer layer 212 may be continuously epitaxially grown by varying impurity concentrations.

Each of the first GaN layers 231 may have a height ranging from about 20 to 100 nm, and each of the second GaN layers 232 may have a height ranging from about 100 to 200 nm.

Figure 2B:
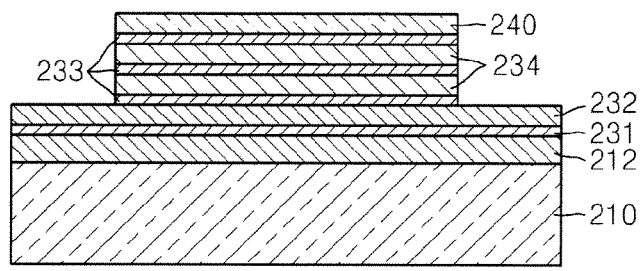

Referring to FIG. 2B, a photoresist pattern 240 is formed on the uppermost second GaN layer 232. The photoresist pattern 240 may have any of various shapes. For example, the photoresist pattern 240 may have a circular shape, an oval shape, or a square shape.

Next, portions of the first GaN layers 231 and the second GaN layers 232 exposed by the photoresist pattern 240 are sequentially etched, but the lowermost first GaN layer 231 and the second GaN layer 232 disposed on the lowermost first GaN layer 231 are not etched. The etching may be performed by adjusting an etching time. First GaN layers 233 and second GaN layers 234 having the same shapes as that of the photoresist pattern 240 are formed.

Although one photoresist pattern 240 is shown in FIG. 1, a plurality of the photoresist patterns 240 may be actually formed on one wafer and the following process may be performed.

Figure 2C:
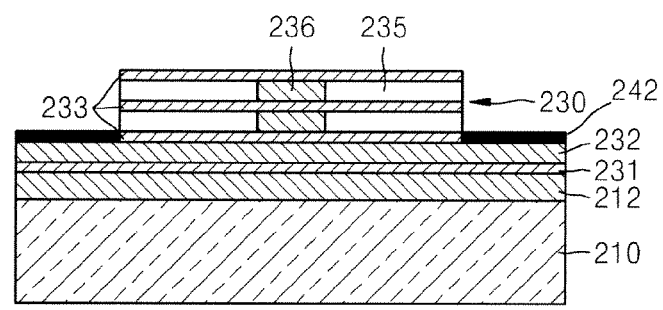

Referring to FIG. 2C, the photoresist pattern 240 is removed, and a first electrode 242 is formed on an exposed portion of the second GaN layer 232 which is a lowermost layer. The first electrode 242 is formed to surround the patterned first GaN layers 233.

Next, exposed side surfaces of the second GaN layers 234 are etched by using electrochemical etching. In detail, the substrate 210 is put in a container (not shown) in which a predetermined etching solution, such as an oxalic acid solution, is contained, and different voltages are applied to the first electrode 242 and a second electrode (not shown) in the container. For example, a positive (+) voltage may be applied to the first electrode 242 and a negative (−) voltage may be applied to the second electrode. As time passes, the second GaN layers 234 are etched, and air layers 235 and second GaN layers 236 surrounded by the air layers 235 are formed. A reflector 230 corresponding to the reflector 130 of FIG. 1 is formed.

When a predetermined voltage applied to the first electrode 242 is greater than a predetermined voltage, for example, 10 V, the air layers 235 are formed in the second GaN layers 234. An area of each of the second GaN layers 236 may be about 10 to 20% of a total area of each of the air layers 235 and each of the second GaN layers 236. When the area of the second GaN layer 236 is less than 10%, the reflector 230 may be structurally unstable and thus may be easily broken. When the area of the second GaN layer 236 is greater than 20%, reflection efficiency of the reflector 230 may be reduced.

An area of the air layer 235 may be adjusted according to a voltage applied during the electrochemical etching, a doping concentration of the second GaN layers 232, and an etching time.

Figure 2D:
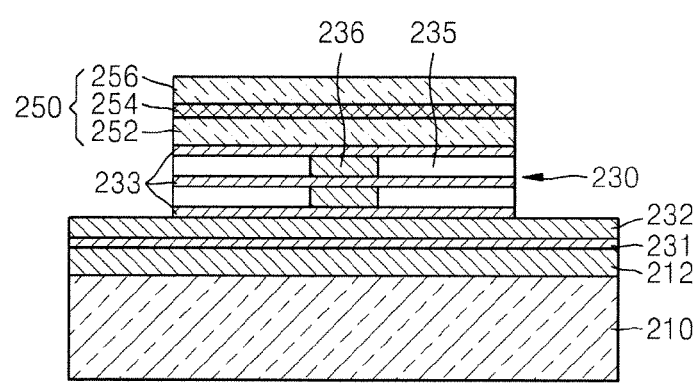

Referring to FIG. 2D, after the first electrode 242 is removed, and a light-emitting unit 250 is epitaxially grown on the uppermost first GaN layer 233. First, an n-type semiconductor layer 252 may be formed on the first GaN layer 233. The n-type semiconductor layer 252 may be formed of a nitride semiconductor doped with n-type impurities. That is, the n-type semiconductor layer 252 may be formed by doping a semiconductor material having a composition represented by $Al_xIn_yGa_{(1-x-y)}N$ (where $0≤x≤1$, $0≤y≤1$, and $0≤x+y≤1$) with n-type impurities. Examples of the nitride semiconductor used to form the n-type semiconductor layer 252 may include GaN, AlGaN, and InGaN, and examples of the n-type impurities may include Si, Ge, Se, and Te. The n-type semiconductor layer 252 may be grown by using MOCVD, HVPE, or MBE.

An active layer 254 is grown on the n-type semiconductor layer 252. The active layer 254 may be formed of a semiconductor material having a composition represented by $In_xGa_{1-x}N (0≤x≤1)$ which may emit light having a predetermined energy due to recombination between electrons and holes and may adjust a band gap energy according to the content of indium. Also, the active layer 254 may be an MQW layer in which quantum barrier layers and quantum well layers are alternately stacked.

A p-type semiconductor layer 256 is formed on the active layer 254. The p-type semiconductor layer 256 may be formed of a nitride semiconductor doped with p-type impurities. That is, the p-type semiconductor layer 256 may be formed by doping a semiconductor material having a composition represented by $Al_xIn_yGa_{(1-x-y)}N$ (where $0≤x≤1$, $0≤y≤1$, and $0≤x+y≤1$) with p-type impurities. Examples of the nitride semiconductor used to form the p-type semiconductor layer 256 may include GaN, AlGaN, and InGaN, and examples of the p-type impurities may include Mg, Zn, and Be. The p-type semiconductor layer 256 may be grown by using MOCVD, HVPE, or MBE.

Figure 2E:
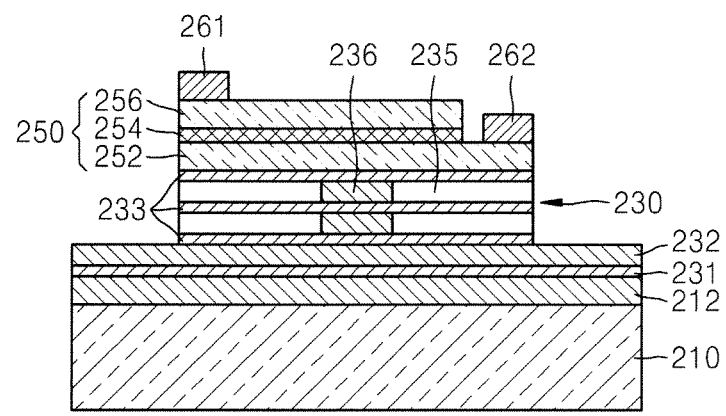

Referring to FIG. 2E, portions of the p-type semiconductor layer 256 and the active layers 254 are etched in a mesa shape to expose a portion of the n-type semiconductor layer 252. Next, a p-type electrode 261 is formed on the p-type semiconductor layer 256, and an n-type electrode 262 is formed on the exposed portion of the n-type semiconductor layer 252.

Since first GaN layers and second GaN layers formed of the same material are alternately grown by varying impurity concentrations, the method of FIGS. 2A through 2E may easily manufacture a light-emitting device.

Also, a plurality of light-emitting device chips each including a reflector and a light-emitting unit, which are disposed on a substrate, may be manufactured at a wafer level.

Figure 3:
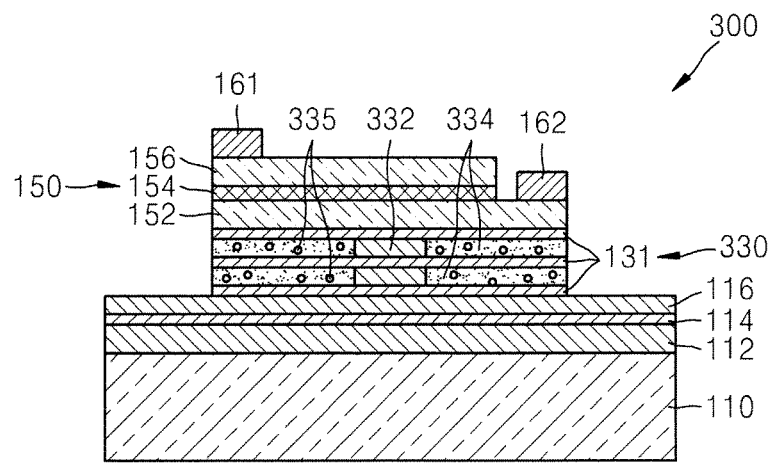
FIG. 3 is a cross-sectional view of a light-emitting device according to another embodiment of the inventive concept.

FIG. 3 is a cross-sectional view of a light-emitting device 300 according to another embodiment of the inventive concept. Substantially the same elements as those in FIG. 1 are denoted by the same reference numerals, and a detailed explanation thereof will not be given.

Referring to FIG. 3, the light-emitting device 300 includes a GaN-based reflector 330 that is formed on the substrate 110, and the light-emitting unit 150 that is formed on the reflector 330. The substrate 110 may be formed of, for example, Si or sapphire.

The reflector 330 may include, for example, seven to fifteen of first GaN layers 131 and second GaN layers 332 formed between the first GaN layers 131. For convenience, 3 first GaN layers 131 and 2 second GaN layers 332 formed between the first GaN layers 131 are shown in FIG. 3. The second GaN layers 332 of the reflector 330 disposed between the first GaN layers 131 are partially etched at their edges to form air holes 335 in the second GaN layers 332. Hereinafter, spaces of the air holes 335 are referred to as cavity layers 334. Since the cavity layers 334 have a refractive index different from that of the first GaN layers 131, the cavity layers 334 enable light emitted by the light-emitting unit 150 to be reflected upward.

Since the second GaN layers 332 surrounded by the cavity layers 334 have little refractive index difference from the first GaN layers 131, reflection efficiency of the second GaN layers 332 is very low. Accordingly, when an area of each of the cavity layers 334 is greater than an area of each of the second GaN layers 332 surrounded by the cavity layer 334, reflection efficiency of the reflector 330 is improved. An area of the second GaN layer 332 may be about 15% or less of a total area of the cavity layer 334 and the second GaN layer 332. When the area of the second GaN layer 332 is greater than 15%, reflection efficiency of the reflector 330 is reduced.

An area of the cavity layer 334 may be adjusted according to a voltage applied during the electrochemical etching, a doping concentration of the second GaN layer 332, and an etching time. In particular, a voltage applied to form the cavity layer 334 is a predetermined voltage, for example, a voltage equal to or less than 10 V. When a voltage higher than the predetermined voltage is applied, an air layer in the structure of FIG. 1 may be formed.

Each of the air holes 335 may have a diameter ranging from about 1 to 10 nm. A height of the cavity layer 334, that is, a height of the second GaN layer 332 between the first GaN layers 131, may range from about 100 to 200 nm. A height of the first GaN layer 131 may range from about 20 to 100 nm.

Other elements of the light-emitting device 300 are substantially the same as those of the light-emitting device 100 of FIG. 1, and thus a detailed explanation thereof will not be given.

According to the one or more embodiments of the inventive concept, a nitride-based omnidirectional reflector having a high reflectance is realized with a smaller number of pairs of layers due to a high refractive index difference between adjacent nitride semiconductor layers. Also, since a light-emitting unit is grown on the nitride-based omnidirectional reflector according to light-emitting device chips, stress and internal defects during growth are reduced, thereby improving light extraction efficiency.

While the inventive concept has been particularly shown and described with reference to exemplary embodiments thereof, it will be understood that various changes in form and details may be made therein without departing from the spirit and scope of the following claims.

What is claimed is:

1. A light-emitting device comprising:
a base nitride semiconductor layer;
a nitride-based reflector disposed on the base nitride semiconductor layer; and
a light-emitting unit disposed on the nitride-based reflector,
wherein the nitride-based reflector includes undoped nitride semiconductor layers and heavily-doped nitride semiconductor layers that are alternately stacked, each of the heavily-doped nitride semiconductor layers has a smaller area than those of adjacent undoped nitride semiconductor layers to have air layers between the adjacent undoped nitride semiconductor layers, and the base nitride semiconductor layer has an area not smaller than the area of the undoped nitride semiconductor layers and has the same doping as the heavily-doped nitride semiconductor layers.

2. The light-emitting device of claim 1, wherein the nitride-based reflector is formed of GaN.

3. The light-emitting device of claim 1, wherein the nitride-based reflector comprises 5 to 10 undoped nitride semiconductor layers, and heavily doped nitride semiconductor layers disposed between the undoped nitride semiconductor layers.

4. The light-emitting device of claim 1, wherein an area of each of the heavily doped nitride semiconductor layers is about 10 to 20% of a total area of each of the heavily doped nitride semiconductor layers and each of the air layers.

5. The light-emitting device of claim 4, wherein a height of the air layer ranges from about 100 to 200 nm.

6. The light-emitting device of claim 4, wherein a height of the undoped nitride semiconductor layer ranges from 20 to 100 nm.

7. The light-emitting device of claim 1, wherein the light-emitting unit is disposed on an uppermost layer of the nitride-based reflector.

8. The light-emitting device of claim 1, wherein the base nitride semiconductor layer has the same composition and doping as the heavily-doped nitride semiconductor layers.

9. A light-emitting device comprising:
a nitride-based reflector; and
a light-emitting unit disposed on the nitride-based reflector,
wherein the nitride-based reflector includes lightly-doped nitride semiconductor layers and heavily-doped nitride semiconductor layers that are alternately stacked, the lightly-doped and heavily-doped nitride semiconductor layers are doped with impurities of a same type, and each of the heavily-doped nitride semiconductor layers has a smaller area than those of adjacent lightly-doped nitride semiconductor layers so as to have air layers between the adjacent lightly-doped nitride semiconductor layers.

* * * * *